United States Patent [19]

Ohlenburger

[11] Patent Number: 5,012,387
[45] Date of Patent: Apr. 30, 1991

[54] PRINTED CIRCUIT BOARD WITH HEAT DISSIPATING DEVICE

[75] Inventor: Hans Ohlenburger, Uberlingen/Bodensee, Fed. Rep. of Germany

[73] Assignee: Bodenseewerk Geratetechnik GmbH, Fed. Rep. of Germany

[21] Appl. No.: 339,680

[22] Filed: Apr. 18, 1989

[30] Foreign Application Priority Data

Apr. 21, 1988 [DE] Fed. Rep. of Germany ....... 3813364

[51] Int. Cl.$^5$ ............................................. H05K 7/20
[52] U.S. Cl. .................................. 361/388; 165/80.3; 174/252; 357/81; 361/414
[58] Field of Search ............... 165/80.3, 80.4, 185, 165/104.33; 174/16.3, 68.5(U.S. only), 252, 256, 260, 257; 357/70, 80, 81; 361/382, 386–388, 406, 410, 414

[56] References Cited

U.S. PATENT DOCUMENTS

| | | | |
|---|---|---|---|
| 3,781,596 | 12/1973 | Galli | 174/257 |
| 4,368,503 | 1/1983 | Kurosawa | 361/385 |
| 4,639,835 | 1/1987 | Daubresse | 361/421 |
| 4,677,252 | 6/1987 | Takahashi | 174/257 |
| 4,714,952 | 12/1987 | Takekawa | 361/421 |
| 4,764,847 | 8/1988 | Eisenblatter | 361/388 |
| 4,810,563 | 3/1989 | De Gree | 174/257 |
| 4,827,377 | 5/1989 | Butt | 361/388 |
| 4,854,038 | 8/1989 | Wiley | 174/68.5 |

FOREIGN PATENT DOCUMENTS

| | | |
|---|---|---|
| 0055578 | 7/1982 | European Pat. Off. . |
| 3035749A1 | 5/1982 | Fed. Rep. of Germany . |
| 3115017A1 | 11/1982 | Fed. Rep. of Germany . |
| 3331112A1 | 3/1985 | Fed. Rep. of Germany . |
| 1471003 | 1/1967 | France . |
| 2560731 | 9/1985 | France . |

Primary Examiner—Gerald P. Tolin
Attorney, Agent, or Firm—Lee, Mann, Smith, McWilliams & Sweeney

[57] ABSTRACT

To provide heat dissipation from components mounted on a printed circuit board, a copper layer is applied to a printed circuit board. A layer of pure aluminum is applied to this copper layer by electroplating. The printed circuit board is coated on both sides with copper and pure aluminum layers. The components are mounted on one of the copper and pure aluminum layers. The printed circuit board has bores in the regions of the components. The copper and pure aluminum layers extend over the inner walls of these bores, whereby communication is established between the copper and pure aluminum layer in contact with the components and the copper and aluminum layer on the opposite side of the printed circuit board. The pure aluminum layer applied by electroplating is mechanically machined in the region of the components to achieve a planar surface. Areas are left open in the copper and pure aluminum layer. Soldering contacts and strip conductors are arranged provided on the printed circuit board within these left-open areas.

6 Claims, 1 Drawing Sheet

PRINTED CIRCUIT BOARD WITH HEAT DISSIPATING DEVICE

TECHNICAL FIELD

The invention relates to a device for the dissipation of heat from components mounted on a printed circuit board.

BACKGROUND ART

DE-A1-3,331,112 discloses a device for the dissIpation of heat from printed circuit boards. Electrical components are mounted on one side of the printed circuit board. A good heat conducting layer is applied to the side of the printed circuit board on which the components are mounted. DE-A1-3,331,112 describes measures for dissipating the heat from this layer. The layer is a heat conducting sheet metal part, which is affixed to the printed circuit board.

DE-A1-3,035,749 describes a heat dissipating, planar printed circuit board having a core of heat conducting, in particular metallic, material. This core is coated with a copper layer. The copper layer, in turn, carries a layer of anodized electroplated aluminum. The layer of anodized electroplated aluminum is coated with a plastics layer. The layer of anodized electroplated aluminum carries the strip conductors.

In the manufacturing process, the copper layer is electroplated with aluminum. The aluminum layer thus obtained is then converted to anodized aluminum by further treatment.

The heat is dissipated substantially through the metallic core of the printed circuit board. Printed circuit boards having such a metallic core are, however, undesirably heavy. Printed circuit boards of conductive carbon or graphite, which are also suggested in DE-A1-3,035,749, are expensive. The layer of electroplated anodized aluminum is an insulator and does not serve to ensure good heat conduction in the plane of the printed circuit board.

Bores are provided in the printed circuit boards of DE-A1-3,035,749. These bores serve for electrically connecting strip conductors on one side of the printed circuit board with strip conductors on the other side. The function of these bores is not the dissipation of heat from a component to the other side of the printed circuit board.

DE-A1-3,115,017 discloses an electronic component in the form of an integrated circuit which is mounted on a carrier plate, the carrier plate, in turn, being mounted on a printed circuit board. The contact surface with which the carrier plate is mounted on the printed circuit board is metallized for better heat conduction. Metallized bores are provided in the printed circuit board in the region of the component. Through these metallized bores, the carrier plate is is in heat conducting connection with a cooling plate arranged on the back side of the printed circuit board. With this arrangement, one cooling plate is associated with each component. The cooling plates are parts attached to but separate from the printed circuit board.

DISCLOSURE OF THE INVENTION

It is an object of the invention to improve the heat dissipation from printed circuit boards of the type mentioned in the beginning.

It is a further object of the invention to achieve such improvement of the heat dissipation with low expenditure.

According to the invention a copper layer is applied to the printed circuit board, and a layer of pure aluminum is, in turn, applied to saId copper layer.

Thus a layer of pure aluminum is used to provide good heat dissipation. Pure aluminum is a good heat conductor. It is also very lightweight. Therefore a rather thick layer can be applied. This improves the heat dissipation. The aluminum layer is obtained by first applying a copper layer to the printed circuit board. This can be done with well-known techniques. The pure aluminum is applied to this copper layer by electroplating. The aluminum layer can be applied in a pattern which is determined by the pattern of the copper layer. Therefore a thick layer of pure aluminum can be applied to the printed circuit board with simple means.

In order to achieve good heat transfer from the components arranged on the printed circuit board to the heat conducting layer, (a) the printed circuit board is provided with copper and pure aluminum layers on both sides thereof, said components being mounted on one of said copper and pure aluminum layers, (b) said printed circuit board has bores in the regions of said components, and (c) a copper and pure aluminum layer extends over the inner walls of said bores to establish communication between the copper and pure aluminum layer in contact with said components and the copper and pure aluminum layer on the opposite side of the printed circuit board.

Further improvement of the heat transfer from the components to the layer of pure aluminum is achieved if said layer of pure aluminum is applied by electroplating and is machined in the region of said components to provide a planar surface for close thermal contact with said components.

Areas can be left open in said copper and pure aluminum layers in which electrical connecting means, such as strip conductors or soldering contacts, are arranged.

Thus the heat dissipating layer is a cover of pure aluminum extending virtually over the whole surface of the printed circuit board. This facilitates manufacturing and provides good heat dissipation. Pure aluminum is, of course, also a good electrical conductor. Therefore the strip conductors cannot be applied on the layer of pure aluminum. This problem is solved by providing left-open areas in the pure aluminum layer, the strip conductors and the soldering contacts of the components being arranged in such left-open areas.

An embodiment of the invention is described hereinbelow with reference to the accompanying drawings.

PREFERRED EMBODIMENT OF THE INVENTION

Figure 1:
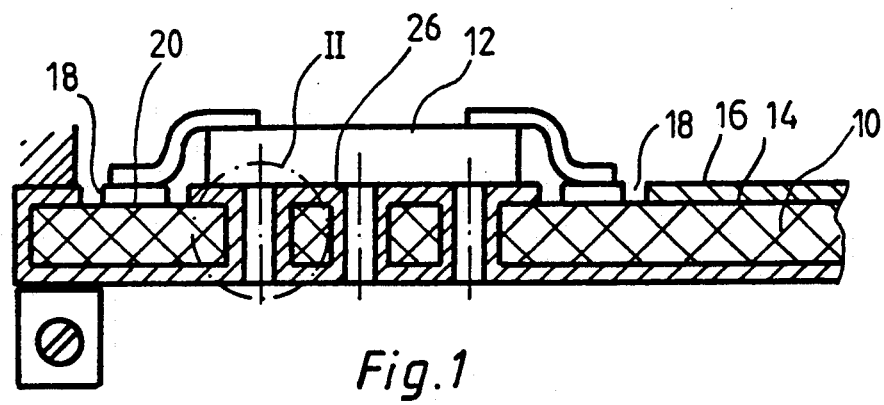
FIG. 1 shows schematically a sectional view of a printed circuit board having a well heat conducting layer and an electric component arranged on the printed circuit board.
Figure 2:
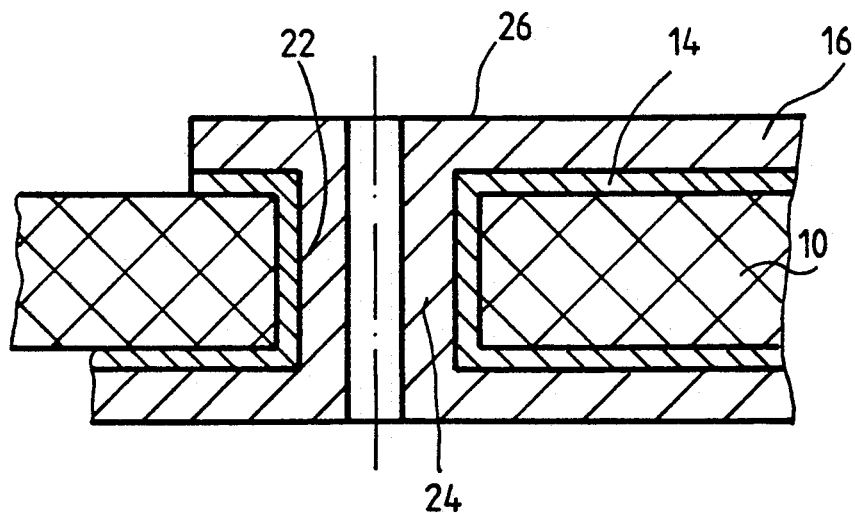
FIG. 2 shows, at an enlarged scale, a detail indicated by the dashed circle II in FIG. 1.

Referring to FIGS. 1 and 2, numeral 10 designates a printed circuit board or printed circuit board core. The printed circuit board 10 carries electrical and electronic components, of which component 12 is illustrated in FIG. 1. As can be seen more clearly in FIG. 2, a copper layer 14 is applied to the printed circuit board. A rather thick layer of pure aluminum is applied to this copper layer by electroplating. The copper layer denoted at 14 and the pure aluminum layer 16 are provided both on the upper side (as viewed in FIG. 1), where the components are mounted, and on the lower side (as viewed in FIG. 1) of the printed circuit board. Areas 18 are left open in the copper and pure aluminum layers 14 and 16, respectively. Strip conductors or soldering contacts 20 are provided on the printed circuit board 10 within these left-open areas.

The printed circuit board 10 has bores in the regions of the components 12. The inner walls of the bores are also coated with the copper layer 14 and, on the top of this copper layer, with the pure aluminum layer 16 denoted of 24. This provides a connection of good heat conductivity between the upper pure aluminum layer 16 (as viewed FIG. 1) with which the component 12 is in contact, and the pure aluminum layer on the lower surface of the printed circuit board 10. In this way, good heat dissipation from the component 12 to the opposite layer of pure aluminum is achieved.

The surface 26 of the layer 16 of pure aluminum is machined in the region in which the component is mounted to provide a surface of good planarity. This ensures close contact between the component 12 and the pure aluminum layer 16. Such contact also improves the heat dissipation.

The thickness of the copper layer is in the micrometer range, while the pure aluminum layer has a comparity great thickness up to 1 millimeter.

The material of the printed circuit boards is conventional, such as epoxy resin.

I claim:

1. A printed circuit board comprising:
   a printed circuit board core having two opposite sides;
   a copper layer located on said two opposite sides of said printed circuit board core;
   a pure aluminum layer covering said copper layer in direct contact therewith on both said opposite sides of said printed circuit board core;
   a predetermined number of circuit components mounted on said pure aluminum layer on one of said two opposite sides of said printed circuit board core;
   said printed circuit board core containing a predetermined number of throughbores extending between said two opposite sides;
   said copper layer located on said two opposite sides and said pure aluminum layer covering said copper layer on said two opposite sides of said printed circuit board core, extending through said predetermined number of throughbores; and
   selected ones of said circuit components physically contacting the pure aluminum layer and covering selected ones of said thoughbores.

2. The printed circuit board as defined in claim 1, wherein:
   said copper layer has a predetermined thickness; and,
   said pure aluminum layer has a thickness greater than said predetermined thickness of said copper layer.

3. The printed circuit board as defined in claim 1 wherein:
   said pure aluminum layer is provided with a planar surface at mounting locations of said predetermined number of circuit components for establishing close thermal contact between said circuit components and said pure aluminum layer.

4. The printed circuit board as defined in claim 1, wherein:
   said copper layer contains preselected uncovered areas which are not covered by said pure aluminum layer; and
   connecting means provided at said preselected uncovered areas of said copper layer.

5. The printed circuit board as defined in claim 4, wherein:
   said connecting means comprise strip conductors.

6. The printed circuit board as defined in claim 5, wherein:
   said connecting means comprise contact elements for making soldered connections.

* * * * *